United States Patent [19]
Woosley et al.

[11] Patent Number: 5,708,300
[45] Date of Patent: Jan. 13, 1998

[54] SEMICONDUCTOR DEVICE HAVING CONTOURED PACKAGE BODY PROFILE

[76] Inventors: Alan H. Woosley, 5702 Barker Ridge, Austin, Tex. 78759; Everitt W. Mace, Rte. 1 Box 35, Hutto, Tex. 78634

[21] Appl. No.: 523,664

[22] Filed: Sep. 5, 1995

[51] Int. Cl.$^6$ ............................................. H01L 23/04
[52] U.S. Cl. ........................................ 257/730; 257/787
[58] Field of Search .............................. 257/787, 701, 257/778, 730

[56] References Cited

U.S. PATENT DOCUMENTS

| | | | |
|---|---|---|---|
| 3,978,578 | 9/1976 | Murphy | 29/577 |
| 5,191,403 | 3/1993 | Nakazawa | 257/787 |
| 5,289,039 | 2/1994 | Ishida et al. | 257/796 |
| 5,319,522 | 6/1994 | Mehta | 257/787 |
| 5,355,283 | 10/1994 | Marrs et al. | 257/787 |
| 5,554,887 | 9/1996 | Sawai et al. | 257/787 |

*Primary Examiner*—Sara W. Crane
*Assistant Examiner*—Roy Potter

[57] ABSTRACT

An overmolded semiconductor device (30, 50) has a contoured package body profile instead of a conventional flat package body surface for uniform filling during the molding process. A cross-section of the semiconductor device reveals a substantially uniform thickness of plastic (36 and 38) covering the carrier substrate (14) and overmolding the semiconductor die (12). Alternatively, a thicker layer of plastic (58) overmolds the semiconductor die (12') than the layer of plastic (56) covering the carrier substrate (14'). The contoured package body profile is designed to allow a uniform flow front progression of molding compound during the molding process to eliminate voids in the package body by providing the same resistive pressure to the molding compound flow front during filling.

18 Claims, 2 Drawing Sheets

SEMICONDUCTOR DEVICE HAVING CONTOURED PACKAGE BODY PROFILE

FIELD OF THE INVENTION

The present invention relates generally to a semiconductor device, and more specifically to a semiconductor device having a contoured package body and a method for its fabrication.

BACKGROUND OF THE INVENTION

A semiconductor die is a microchip having intricate circuitry on its active surface which performs various functions, such as controlling a computer, storing data, processing signals for a pager, and the like. In order for a semiconductor die to operate as intended, it is often necessary to package the die to provide it with external electrical connections which can be connected to a printed circuit board. A packaged semiconductor device typically has a package body to protect the semiconductor die and the internal electrical connections from handling damage and from being contaminated by the environment. One common type of package body is made from plastic.

In the semiconductor device manufacturing area, plastic package bodies are composed of a polymeric molding compound, typically a thermosetting epoxy-resin based material, which is molded with a transfer molding process to form the package body. One such molded device 10 is illustrated in FIG. 1, wherein a semiconductor die 12 is mounted on a carrier substrate 14 and wire bonded thereto. The package body 16 is formed by transfer molding a molding compound through a system of runners and gates in a mold. A portion of a runner 18 is shown to be still attached to the package body 16 in FIG. 1. Although this process sounds relatively simple, problems exist in trying to mold a void-free package body. Voids, or holes, in the package body, are not desired because they may allow contaminants to become trapped in the package body which increases the chance of contaminants reaching the semiconductor die. Additionally, voids are cosmetic defects that the end user or customer does not want to see, nor does a manufacturer want to send such a device to the customer.

FIGS. 2-5 illustrate, in top views, the typical flow front 20 of a molding compound during the package body molding process. The molding compound enters through the gate (not shown) at the bottom left corner as depicted in FIG. 2. The compound continues to fill the cavity by flowing across the substrate and semiconductor die toward the opposing corner, as shown in FIG. 3. The molding compound hardens or gels as it is filling the mold cavity. As the molding cycle progresses, as illustrated in FIG. 4, the molding compound advances non-uniformly with the mold front 20 advancing faster in the thicker cross section at the edge of the die 12. In the last stage of filling, the compound flow fronts 20 join (knit together) and close off the vent (not shown, but would be located at the top right corner) leaving a portion of the cavity unfilled as depicted in FIG. 5. As a result of non-uniform molding compound front progression, a void 22 (or voids) in the package body are often formed at a corner of the semiconductor die which can sometime even expose a portion of the die surface.

Thus, a need exists for a semiconductor device that allows uniform molding compound front progression to eliminate the package body voiding problem associated with transfer molding.

DETAILED DESCRIPTION OF A PREFERRED EMBODIMENT

Generally, the invention provides a semiconductor device having a semiconductor die mounted upon a carrier substrate. The die is electrically connected to the substrate either by wire bonds or by equivalent means. A plastic package body is overmolded over the semiconductor die to protect it. However, instead of a conventional flat package body surface, the package body of the present invention is contoured such that, in one embodiment, a cross-section of the semiconductor device reveals a substantially uniform thickness of plastic covering the carrier substrate and overmolding the semiconductor die. In another embodiment, a cross-section of the contoured package body reveals that a thicker layer of plastic overmolds the semiconductor die than the layer of plastic covering the carrier substrate. In both embodiments, the contoured package body is designed to allow a uniform flow front progression of molding compound during the transfer molding process to eliminate voids in the package body.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

Figure 1:
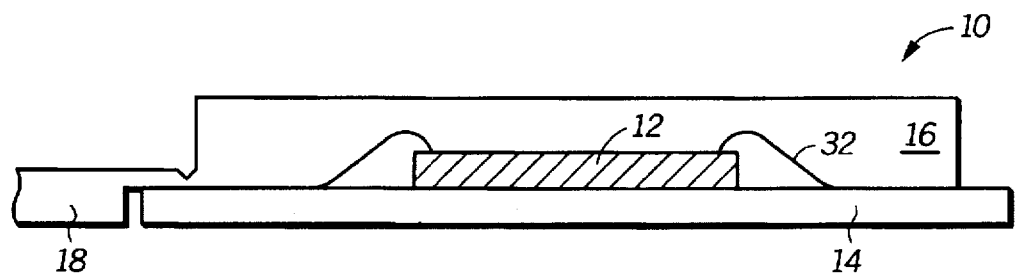
FIG. 1 illustrates, in cross-section, a molded semiconductor device as known in the prior art.
Figure 2:
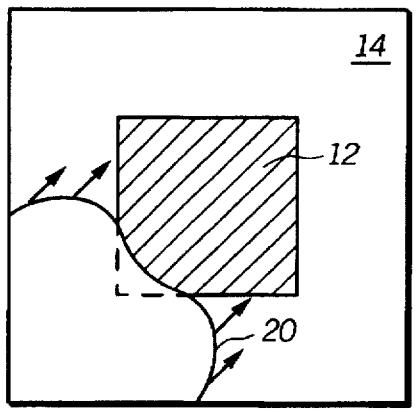
FIGS. 2-5 illustrate, in top views, the molding compound front progression as known in the prior art during the process of molding a device of FIG. 1.
Figure 3:
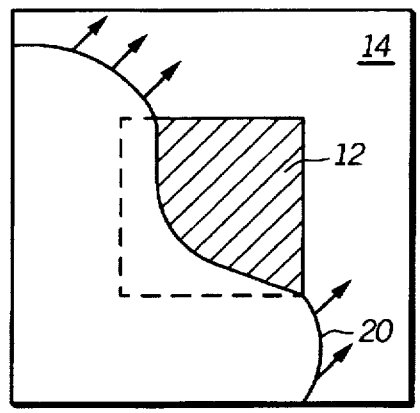
Figure 4:
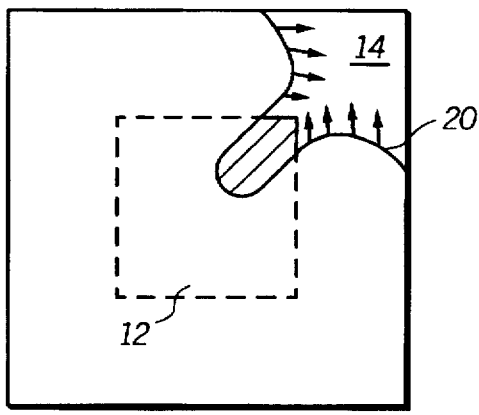
Figure 5:
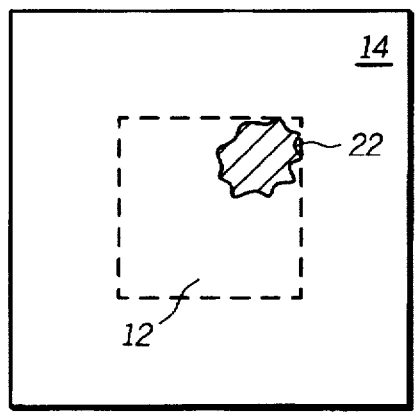
Figure 6:
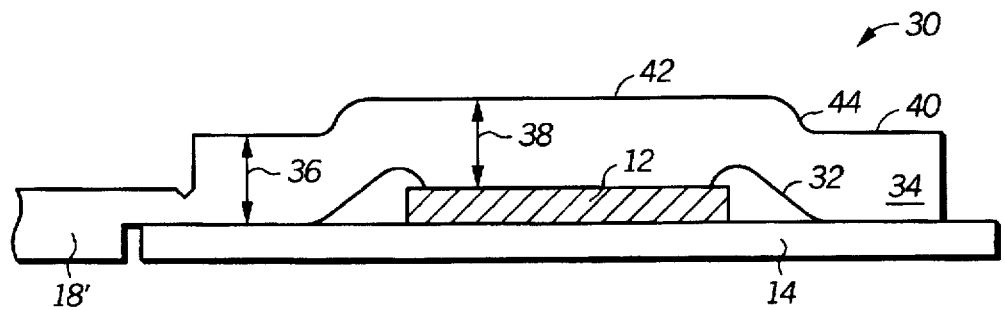
FIG. 6 illustrates, in cross-section, a semiconductor device having a contoured package body in a first embodiment of the invention.
Figure 7:
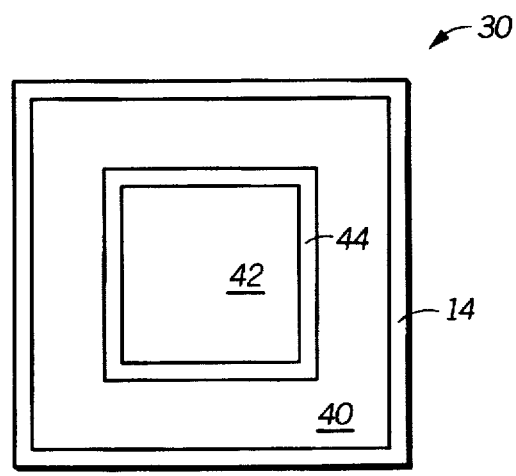
FIG. 7 illustrates, in a top view, the device of FIG. 6.
Figure 8:
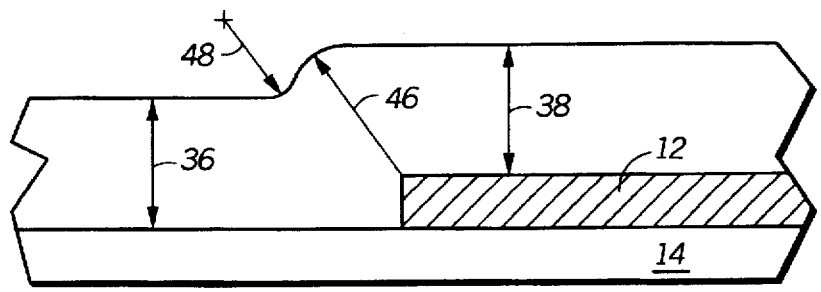
FIG. 8 illustrates, in cross-section, an enlarged portion of the device of FIG. 6.

FIGS. 6-8 illustrate a semiconductor device 30 having a contoured package body in a first embodiment of the invention. In FIG. 6, a cross-section view of the device 30 is shown, while FIG. 7 shows a top view of the same device, and FIG. 8 illustrates an enlarged portion of FIG. 6. The semiconductor die 12 is mounted upon carrier substrate 14, which is typically composed of an epoxy-glass cloth material such as those used to form printed circuit boards. The die 12 may be attached using any type of suitable die attach adhesive, such as silver-filled epoxy resin materials, silver-filled silicones, or may be a thermoplastic adhesive. Although not specifically illustrated, carrier substrate 14 would have conductive traces on its surface for electrical connections and routing. Additionally, carrier substrate 14 may have conductive traces on its bottom surface as well as solder pads for the addition of solder balls, solder columns, pins, or some other equivalent type of external electrical connections to enable the device 30 to be mounted to a next level interconnect.

As shown in FIG. 6, the semiconductor die 12 is electrically connected to the carrier substrate through a plurality of wire bonds 32. Methods of wire bonding are known in the art, and can include low loop wire bonding. However, the invention is in no way limited to wire bonding as a means of establishing electrical connections between the semiconductor die and the carrier substrate. Other methods of forming electrical contact can be used, such as flip-chip bonding, inverted TAB bonding, or using a Z-axis conductive die attach material. The type of semiconductor die that would most likely benefit from the present invention include, but are not limited to, a microcontroller unit (MCU), a microprocessor (MPU), a memory, a digital signal processor (DSP), a reduced instruction set chip (RISC), and an application specific integrated circuit (ASIC).

The package body 34 is illustrated in FIG. 6 to be contoured, wherein one top surface 40 over the carrier substrate 14 and the other top surface 42 over the semiconductor die 12 are on different planes. An enlarged drawing of this portion of the device is depicted in FIG. 8. The contoured design of the present invention is deliberate so that the thickness 36 of the package body, that portion of the package body covering the carrier substrate 14, and the thickness 38 of the package body, that portion covering the semiconductor die 12, are substantially the same. This can be accomplished by forming a step in the upper mold platen of the transfer molding equipment to create a uniform thickness across the package body. Other aspects of the transfer molding equipment do not require modification and are known in the art. The curved portion 44 of the package body which provides the transition between the two top surfaces 40 and 42 is designed to allow a smoother flow path for the molding compound during the filling of the die cavity. Additionally, the curvature eliminates stress points and allows easy removal of the package body from the mold. Alternatively, other non-orthogonal surfaces, such as chamfers or other contours, may be used as the connecting surface between the two top surfaces 40 and 42. The radius 46 from the edge of the die 12 to the contoured surface 44 is the same as the cross-sectional thickness 36 or 38 By holding the cross-section constant, the cavity presents the same resistive pressure to the molding compound material flow to allow uniform filling. Additionally, a radius 48 may be desirable on the outside of the package body to allow easy removal of the molded device from the mold cavity. For example, the radius 48 may be designed at 0.5 mm.

Other than the modification to the upper mold platen as described above, the transfer molding process to form this package body does not require significant re-engineering. The process parameters for the molding would have to be optimized for a particular molding compound used, but such a step is also required with devices of the prior art design, which a person of ordinary skill in this art would possess the skill to do. Molding compounds that can be used for the package body include, but are not limited to polymeric transfer molding compounds, injection molding materials, or liquid systems that could be used for encapsulation. Moreover, practicing this invention can be performed on, but not limited to, conventional or multiplunger molding systems. Additionally, the invention can also be applied to plate molds, which have their material gate in the top edge of the mold.

Figure 9:
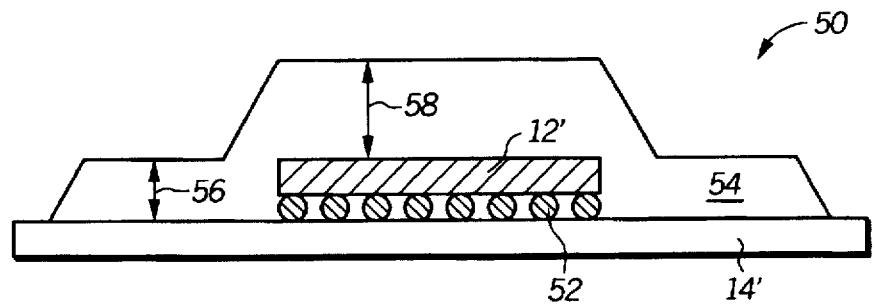
FIG. 9 illustrates, in cross-section, a semiconductor device having a different contoured package body in a second embodiment of the invention.

FIG. 9 illustrates, in cross-section, a semiconductor device 50 having a different contoured package body 54 in a second embodiment of the invention. In this embodiment, the semiconductor die 12' is depicted to be flip-chip bonded to the carrier substrate 14' using a plurality of interconnect bumps 52. Again, for ease of illustration, the conductive traces on carrier substrate 14' have not been explicitly illustrated but are understood to be inherently present. It should be understood that although flip-chip bonding is illustrated, a person practicing this embodiment of the invention is not limited to flip-chip methods but can also use wire bonding, flip-TAB, or Z-axis conductive die attach. In this embodiment, the package body is contoured such that the thickness 56, that portion covering the carrier substrate, is thinner than the thickness 58, that portion covering the semiconductor die. This can be accomplished by putting the appropriate size step in the upper mold platen. The intent is to force uniform flow of molding compound across the semiconductor die surface so as to eliminate the formation of voids at the corner of the die. The ratio between the two thicknesses should be determined either empirically or through modeling based upon specific geometry as well as the type of internal electrical connections used, because the presence of wire bonds is known to retard the compound front progression. Nevertheless, it is expected that the ratio of the first thickness 56 to the second thickness 58 would be in the range of 0.3 to 0.8.

The foregoing description and illustrations contained herein demonstrate many of the advantages associated with the present invention. In particular, it has been revealed that a semiconductor device having a contoured package body allows a uniform flow progression of molding compound during the transfer molding process to eliminate the formation of voids at the corner of the semiconductor die opposite from the gate area. The contouring can be tailored for different die sizes such that a cross-sectional thickness would show either a same amount of plastic over the carrier substrate as over the semiconductor die, or that it would show a thinner amount of plastic over the carrier substrate than over the semiconductor die, depending on what is required to provide uniform flow across the semiconductor die.

Thus it is apparent that there has been provided, in accordance with the invention, a semiconductor device having a contoured package body and a method for its fabrication that fully meet the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the described embodiments can utilize different gate locations, molding methods, or molding materials. Furthermore, other package types using substrates may derive benefit from practicing this invention. Therefore, it is intended that this invention encompasses all such variations and modifications falling within the scope of the appended claims.

We claim:

1. A semiconductor device comprising:
    a semiconductor die mounted upon a surface of a carrier substrate and electrically connected thereto; and
    a plastic package body formed over the Surface of the carrier substrate and over the semiconductor die, the plastic package body being contoured such that the plastic package body has a first major surface overlying a portion of the carrier substrate on a first plane and a second major surface overlying the semiconductor die on a second plane, and such that in a cross-section of the semiconductor device, a thickness of the plastic package body above the surface of the carrier substrate is substantially equal to a thickness of the plastic package body above the semiconductor die.

2. The device of claim 1, wherein the semiconductor die is wire bonded to the carrier substrate.

3. The device of claim 1, wherein the plastic package body is composed of a polymeric epoxy-resin based molding compound.

4. The device of claim 1, wherein the plastic package body is further characterized as having a non-orthogonal portion of the plastic package body which connects said first and second major surfaces.

5. The device of claim 1, wherein the semiconductor die is flip-chip bonded to the carrier substrate.

6. The device of claim 1, wherein the semiconductor die is characterized as one selected from a group consisting of: a microcontroller unit (MCU), a microprocessor (MPU), a memory, a digital signal processor (DSP), a reduced instruction set chip (RISC), and an application specific integrated circuit (ASIC).

7. The device of claim 1 wherein said first and second major surfaces are substantially parallel to one another.

8. A semiconductor device comprising:

a semiconductor die mounted upon a surface of a carrier substrate and electrically connected thereto; and a plastic package body formed over the surface of the carrier substrate and over the semiconductor die, the plastic package body being contoured such that the plastic package body has a first major surface overlying a portion of the carrier substrate on a first plane and a second major surface overlying the semiconductor die on a second plane, and such that in a cross-section of the semiconductor device, a first thickness of the plastic package body above the surface of the carrier substrate is less than a second thickness of the plastic package body above the semiconductor die.

9. The device of claim 8, wherein the semiconductor die is wire bonded to the carrier substrate.

10. The device of claim 8, wherein the plastic package body is composed of a polymeric epoxy-resin based molding compound.

11. The device of claim 8, wherein the first thickness of the plastic package body is approximately 0.3 to 0.8 of the second thickness of the plastic package body.

12. The device of claim 8, wherein the semiconductor die is flip-chip bonded to the carrier substrate.

13. The device of claim 8, wherein the semiconductor die is characterized as one selected from a group consisting of: a microcontroller unit (MCU), a microprocessor (MPU), a memory, a digital signal processor (DSP), a reduced instruction set chip (RISC), and an application specific integrated circuit (ASIC).

14. The device of claim 8 wherein said first and second major surfaces are substantially parallel to one another.

15. The device of claim 8 wherein the plastic package body is further characterized as having a non-orthogonal portion which connects said first and second major surfaces.

16. A semiconductor device comprising:

a semiconductor die mounted upon a surface of a carrier substrate and electrically coupled thereto; and a molded plastic package body overlying the surface of the carrier substrate and the semiconductor die, the plastic package body being contoured so as to have a substantially uniform thickness over the surface of the carrier substrate and over the semiconductor die.

17. The device of claim 16 wherein the plastic package body further has a stepped portion corresponding in location to an edge of the semiconductor die.

18. The device of claim 17 wherein the stepped portion of plastic package body has a non-orthogonal surface.

* * * * *